United States Patent
Yu et al.

(10) Patent No.: US 10,510,988 B2
(45) Date of Patent: Dec. 17, 2019

(54) ANTI-REFLECTION FILM AND FLEXIBLE DISPLAY DEVICE INCLUDING ANTI-REFLECTION FILM

(71) Applicant: WuHan TianMa Micro-Electronics Co., Ltd., Wuhan (CN)

(72) Inventors: Quanpeng Yu, Wuhan (CN); Yang Zeng, Wuhan (CN); Chuanli Leng, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 15/952,992

(22) Filed: Apr. 13, 2018

(65) Prior Publication Data

US 2019/0027707 A1    Jan. 24, 2019

(30) Foreign Application Priority Data

Jul. 21, 2017  (CN) .......................... 2017 1 0599340

(51) Int. Cl.
| | |
|---|---|
| H01L 51/52 | (2006.01) |
| H01L 27/32 | (2006.01) |
| G02B 5/30 | (2006.01) |
| G02B 1/111 | (2015.01) |
| H01L 51/56 | (2006.01) |

(52) U.S. Cl.
CPC .......... H01L 51/5281 (2013.01); G02B 1/111 (2013.01); G02B 5/3025 (2013.01); G02B 5/3083 (2013.01); H01L 27/3276 (2013.01); H01L 27/323 (2013.01); H01L 51/56 (2013.01); H01L 2251/5338 (2013.01)

(58) Field of Classification Search
CPC ............. H01L 51/5281; H01L 27/3276; H01L 2251/5338; H01L 27/323; H01L 51/56; G02B 5/3205; G02B 5/3083
USPC ............. 257/40, 59, 72; 438/82, 99, 48, 128
See application file for complete search history.

(56) References Cited

U.S. PATENT DOCUMENTS

| | | | |
|---|---|---|---|
| 6,096,425 A * | 8/2000 | Smith ................ | B29D 11/0073 428/412 |
| 8,344,396 B2 | 1/2013 | Shim et al. | |
| 2012/0037928 A1* | 2/2012 | Shim et al. ......... | H01L 51/5281 257/88 |
| 2018/0149785 A1* | 5/2018 | Lee et al. ............ | H01L 51/0097 |

* cited by examiner

Primary Examiner — Thinh T Nguyen
(74) Attorney, Agent, or Firm — Tarolli, Sundheim, Covell & Tummino LLP

(57) ABSTRACT

The present disclosure provides an anti-reflection film and a flexible display device. The anti-reflection film includes: a linear polarization film stretched in a first stretching direction; and a phase delay film stretched in a second stretching direction. When a light beam passes through the linear polarization film, the light beam is converted into a linear polarized light, and when the light beam passes through the phase delay film, the phase delay film changes a phase of the light beam. A first acute angle α is formed between the first stretching direction and the second stretching direction. The anti-reflection film has a folding axis, and a vertical line of the folding axis is located within the first acute angle α.

13 Claims, 4 Drawing Sheets

ANTI-REFLECTION FILM AND FLEXIBLE DISPLAY DEVICE INCLUDING ANTI-REFLECTION FILM

CROSS-REFERENCE TO RELATED APPLICATIONS

The present application claims the benefit of priority to Chinese Patent Application No. 201710599340.4, filed on Jul. 21, 2017, the content of which is incorporated herein by reference in its entirety.

TECHNICAL FIELD

The present disclosure relates to the field of display technologies and, more particularly, to an anti-reflection film and a flexible display device including the anti-reflection film.

BACKGROUND

For a display panel in the related art, ambient light may enter into the interior of the display panel, and then the internal structure of the display panel may reflect and scatter the ambient light into human eyes, which disturbs recognition of the human eyes on a normal display image of the display panel. Especially, for an organic light-emitting diode (OLED), which includes a metallic cathode and a metallic anode, reflection effects of the metallic electrodes to the ambient light are even stronger. For solving the reflection problem of the ambient light entering into the OLED display panel, an anti-reflection film is usually placed at the exterior of the display panel, which can block the ambient light after reflected or scattered by the internal structure of the display panel from entering into human eyes, thereby improving definition of the display image of the display panel.

Recently, the OLED display panel is used in the field of flexible display, which has properties of bendable, foldable, and rollable. However, when the display panel is bended, folded, or rolled, the anti-reflection film of the display panel may easily crack and fracture under action of stress, which causes failure of the anti-reflection film.

SUMMARY

In view of the above problems, the present disclosure provides an anti-reflection film and a flexible display device including the anti-reflection film, to solve a technical problem of fracture and failure of the conventional anti-reflection film during a bending process.

An aspect of the embodiment of the present disclosure provides an anti-reflection film. The anti-reflection film includes: a linear polarization film stretched in a first stretching direction; and a phase delay film stretched in a second stretching direction. When a light beam passes through the linear polarization film, the light beam is converted into a linear polarized light, and when the light beam passes through the phase delay film, the phase delay film changes a phase of the light beam. A first acute angle α is formed between the first stretching direction and the second stretching direction. The anti-reflection film has a folding axis, and a vertical line of the folding axis is located within the first acute angle α.

Another aspect of the embodiments of the present disclosure provides a flexible display device, including the anti-reflection film and a flexible display panel. The anti-reflection film includes: a linear polarization film stretched in a first stretching direction; and a phase delay film stretched in a second stretching direction. When a light beam passes through the linear polarization film, the light beam is converted into a linear polarized light, and when the light beam passes through the phase delay film, the phase delay film changes a phase of the light beam. A first acute angle α is formed between the first stretching direction and the second stretching direction. The anti-reflection film has a folding axis, and a vertical line of the folding axis is located within the first acute angle α. The flexible display panel is foldable along the folding axis of the anti-reflection film, and the anti-reflection film is adhered to a surface of the flexible display panel.

The anti-reflection film provided by the embodiments of the present disclosure includes a linear polarization film and a phase delay film. The linear polarization film and the phase delay film are stretched films with a first stretching direction and a second stretching direction, respectively. When the folding axis is parallel to the stretching direction, the anti-bending performance is the best. A relation among the folding axis, the first stretching direction, and a second stretching direction is designed to meet a certain requirement, so that a best anti-bending performance of the anti-reflection film is achieved, and thus a bending stability of the flexible display device is guaranteed.

DESCRIPTION OF EMBODIMENTS

Figure 1:
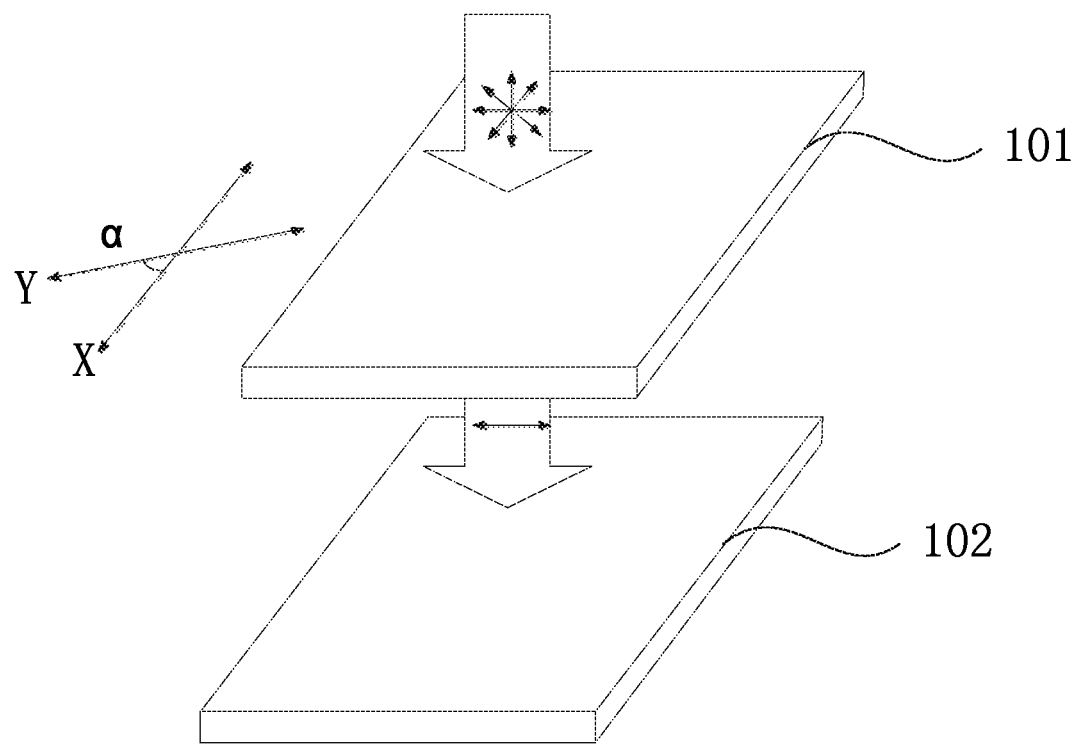
FIG. 1 illustrates a schematic view of an anti-reflection film according to an embodiment of the present disclosure.

Since the described solutions relate to a variety of alternations and multiple embodiments, the embodiments will be illustrated in the drawings and be described in detail in a written description. Hereinafter, the effect and feature of described solutions are more sufficiently described with reference to accompanying drawings, and exemplary embodiments are shown in the drawings. However, the described technology can be embodied in many different forms and should not be construed as being limited to embodiments described herein.

Identical or corresponding components are presented with same reference signs, irrespective of the numbering of the figures. In the specification, when the wording such as "first", "second" is used for describing various components, these components are not necessarily limited to the above wording. Above wording is only used for distinguishing a component from another component.

In the specification, the wording of "including" or "containing" is used for the presence for illustrating the feature and/or component described in the description, but not exclusive to the presence of one or more of the other features and/or one or more of the other components. It will be appreciated that, when layer, area, portion and so on are referred to be "on" another layer, another area, or another portion, the layer, the area, the portion can be directly on another layer, another area, or another portion, or the layer, the area, the portion can be indirectly on another layer, another area, or another portion with a middle layer, a middle area, or a middle portion therebetween.

In the accompanying drawings, for clarity, thickness of layer and area are exaggerated. For example, for ease of description, the thickness and size of the element in accompanying drawings are arbitrarily shown, so that the described technical scope is not limited by the accompanying drawings.

Hereinafter, in one or more illustrative embodiments, X-axis, Y-axis and Z-axis can be not limited to three axes in a rectangular coordinate system, and can be construed widely as including three axes. For example, X-axis, Y-axis and Z-axis can be mutually perpendicular to each other or can represent different directions which are not perpendicular to each other.

In addition, it should be noted that, in some alternative implementing manners, steps of all methods described herein may not happen in sequence. For example, actually, two continuous steps as shown can be performed substantially simultaneously, or the two steps can be performed in reverse order sometimes.

As used in the present disclosure, wording of "and/or" includes any of one or more of related listed items and all combination thereof. When the statement of such as " . . . at least one" is after an element list, the whole list but not a single element is qualified by this statement. In the present disclosure, wording of "substantially" includes meanings of completely, almost completely, or to any significant degree for those of ordinary skills in the art. In addition, "formed, arranged or placed on . . . " can also mean "formed, arranged or placed above . . . ". Term "connection" includes an electrical connection.

Embodiments are illustrated in detail below with reference to the accompanying drawings.

Figure 2A:
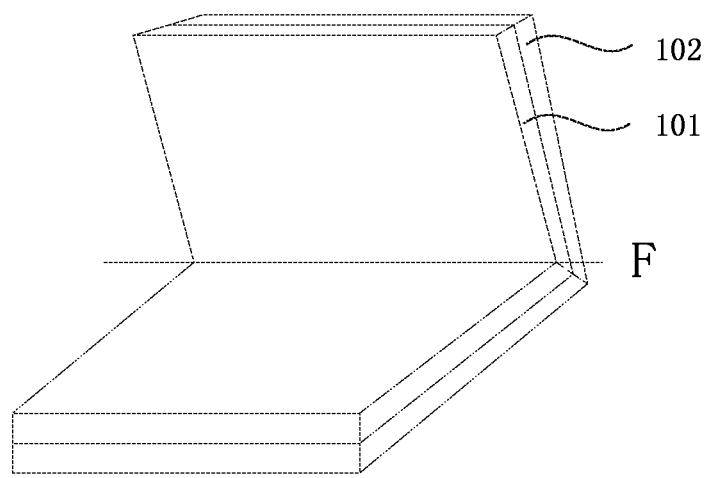
FIG. 2A illustrates a folding state of an anti-reflection film according to an embodiment of the present disclosure.
Figure 2B:
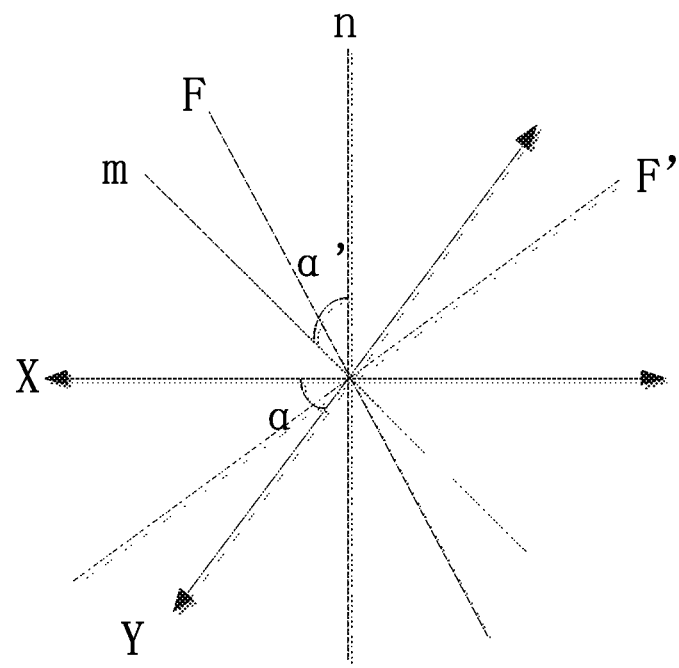
FIG. 2B illustrates a relation graph among a folding axis, a first stretching direction, and a second stretching direction according to an embodiment of the present disclosure.

FIG. 1 is a schematic view of an anti-reflection film according to an embodiment of the present disclosure; FIG. 2A illustrates a folded state of an anti-reflection film according to an embodiment of the present disclosure; and FIG. 2B illustrates a relation graph among a folding axis, a first stretching direction and a second stretching direction according to an embodiment of the present disclosure. Referring to FIGS. 1-2B, an anti-reflection film includes a linear polarization film 101 and a phase delay film 102. A light beam passes through the linear polarization film 101 to form a linearly polarized light in a specific polarization direction. A phase of the light beam can be changed by the phase delay film 102. The linear polarization film 101 is a stretching film with a first stretching direction X, the phase delay film 102 is a stretching film with a second stretching direction Y, and an acute angle α is formed between the first stretching direction X and the second stretching direction Y. The anti-reflection film further includes a folding axis F, and a vertical line of the folding axis F' is located within the acute angle α.

The anti-reflection film according to an embodiment of the present disclosure includes the linear polarization film 101 and the phase delay film 102. The linear polarization film 101 can be made of polyvinyl alcohol (PVA). A high molecular compound polyvinyl alcohol film is used as a substrate, then the substrate is dip-dyed with strong dichroic iodine, then is reduced by aqueous boracic acid to be stable, and finally is stretched along a specific direction. After stretching, iodine molecules are then orderly absorbed on the film, so as to perform polarization performance or polarization detection performance. A component of a light beam passing through the linear polarization film with a vibration direction parallel to an arrangement direction of iodine molecules may be absorbed, while a component of the light beam passing through the linear polarization film with a vibration direction perpendicular to the arrangement direction of iodine molecules may be transmitted through the linear polarization film, so that a transmission direction of the linear polarization film 101 is perpendicular to a stretching direction of the linear polarization film, an absorption axis of the linear polarization film is parallel to the stretching direction of the linear polarization film. Optionally, the substrate can be dip-dyed with a dichroic organic dye, and then is stretched to form a dye type polarization film.

In the present embodiment, the linear polarization film 101 has the first stretching direction X. It is found that, when the linear polarization film is folded, if a folding axis is perpendicular to the first stretching direction X, then the linear polarization film 101 has a relatively good anti-bending performance, and after multiple times of bending, the linear polarization film 101 still has a good bending stability; while if a folding axis is parallel to the first stretching direction X, then the linear polarization film 101 has a relatively poor anti-bending performance, and compared with bending along other directions, the linear polarization film 101 is easily broken. When the film is folded along a folding axis, a direction of the bending stress on the film is perpendicular to the folding axis, and when the folding axis is perpendicular to the stretching direction of the film, then the direction of the bending stress is parallel to the stretching direction of the film, and the film has a stronger tensile strength along the stretching direction.

The phase delay film 102 according to an embodiment of the present disclosure can be made of flexible materials, such as cycloolefin copolymer (COP) and polycarbonate (PC). Take COP as an example, a COP film is stretched along a specific direction, and the polymer molecules are arranged along a stretching direction, so that the COP film after stretched forms an optical axis and shows a birefringence property similar to a birefringent crystal. When light is incident to the stretched COP film, if an incident direction of light is not parallel to an arrangement direction of the polymer molecules, the incident light may decompose into a component with a vibration direction parallel to the arrangement direction of the polymer molecules and a component with a vibration direction perpendicular to the arrangement direction of the polymer molecules. Light propagation speeds of the two components are different, so that a phase difference occurs, and when the light beam passes through the phase delay film, a specific phase delay is formed between an output beam and an incident beam. For a phase delay film formed by stretching, the stretching direction is identical to an optical axis of the phase delay film. The optical axis of the phase delay film has the following function: when an incident direction of incident light is parallel to the optical axis, the birefringence phenomenon will not happen, that is, the incident beam will not decompose.

Similar to the linear polarization film 101, when the phase delay film 102 is folded, if a folding axis is perpendicular to the stretching direction of the phase delay film 102, then the phase delay film 102 has a relatively good anti-bending performance, and after multiple times of bending, the phase delay film 102 still has a good bending stability; while if a folding axis is parallel to the stretching direction of the phase delay film 102, then the phase delay film 102 has a relatively poor anti-bending performance, and compared with bending along other directions, the phase delay film 102 is easily broken. It is found that, the stretched film is stretched along the stretching direction for many times, and the corresponding molecules are aligned and arranged along a specific direction, so that the film generally has a stronger tensile strength along the stretching direction and a better anti-bending performance.

For achieving anti-reflection effect of the anti-reflection film, an included angle is required to be formed between the absorption axis of the linear polarization film 101 and the optical axis of the phase delay film, that is, an acute angle α is formed between the first stretching direction of the linear polarization film 101 and the second stretching direction of the phase delay film, and at this time, the first stretching direction is different from the second stretching direction. It is understood that, when bending the anti-reflection film, a specific position relation among a folding axis direction, the first stretching direction, and the second stretching direction is required to be designed, so that both the linear polarization film 101 and the phase delay film 102 have a good anti-bending performance simultaneously. Referring to FIG. 2B, the linear polarization film is a stretching film with the first stretching direction X, the folding axis of the anti-reflection film is F, and the folding axis F has a vertical line F'. It's known from the above description, when the folding axis F is perpendicular to the first stretching direction X, the linear polarization film 101 has a good anti-bending performance, that is, when located at a position of a straight line n in FIG. 2B, the folding axis F meets requirements for bending stability of the linear polarization film. While for the phase delay film with the second stretching direction Y, when the folding axis F is perpendicular to the second stretching direction Y, the phase delay film has a good anti-bending performance, that is, when located at a position of a straight line m in FIG. 2B, the folding axis F meets requirements for bending stability of the phase delay film. However, the folding axis in one bending action is unique, and the linear polarization film and the phase delay film cannot be placed at a best bending position simultaneously. Thus, the folding axis is limited to be in a range of an acute angle α' between the straight line m and the straight line n, so that the folding axis can be at a position simultaneously closest to the straight line m and the straight line n, and requirements for a best folding position of the linear polarization film and the phase delay film can be met to a greatest extent simultaneously, thereby improving the anti-bending performance of the whole anti-reflection film. It's known according to a geometrical relation, at this time, the vertical line F' of the folding axis is located in a range of the first acute angle α between the first stretching direction and the second stretching direction. It should be noted that, description of "the vertical line F' of the folding axis is located in a range of the first acute angle α" refers to that, the vertical line F' of the folding axis, a straight line along the first stretching direction, and another straight line along the second stretching direction intersect at one point. Therefore, the vertical line F' of the folding axis is in the range of the first acute angle between the first and second stretching directions.

In the anti-reflection film provided by the embodiments of the present disclosure, a stretched film is used, the vertical line of the folding axis is limited in a range of the acute angle between the stretching directions of the linear polarization film and the phase delay film, and a best anti-bending performance is achieved, which can meet requirements for the folding stability of the flexible display panel, and even after folding for many times, the anti-reflection film will not fail.

Since materials of the phase delay film and the linear polarization film are different, along the stretching directions, tensile strengths of the phase delay film and the linear polarization film are different. The tensile strength herein refers to a maximum resistance that a material can withstand when being stretched with a uniform plastic deformation. Before withstanding the maximum tensile stress, deformation of the stretched sample is uniform, but when beyond the maximum tensile stress, necking phenomenon happens, that is, a concentrated deformation happens. For a fragile material without uniform plastic deformation (or very small), the maximum tensile strength reflects a fracture resistance of the material. Generally, the tensile strength of a PVA film is in a range of 60 Mpa-80 Mpa, the tensile strength of a COP film is in a range of 40 Mpa-60 Mpa; and the tensile strength of a PC film is in a range of 40 Mpa-70 Mpa. The tensile strength of the film along a certain direction may affect the fracture resistance along a corresponding direction. In embodiments of the present disclosure, optionally, when the tensile strength along the first stretching direction of the linear polarization film 101 is greater than the tensile strength along the second stretching direction of the phase delay film 102, the vertical line F' of the folding axis can be placed closer to the second stretching direction Y; and when the tensile strength along the first stretching direction of the linear polarization film 101 is smaller than the tensile strength along the second stretching direction of the phase delay film 102, the vertical line F' of the folding axis can be placed closer to the first stretching direction X.

Figure 3:
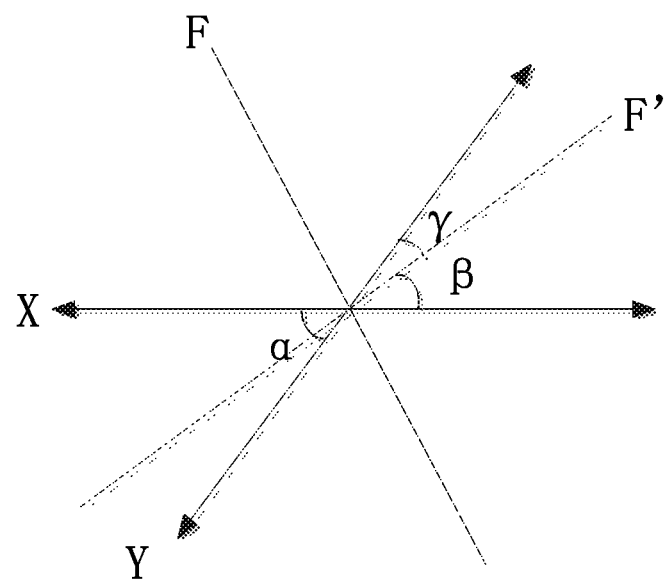
FIG. 3 illustrates another relation graph among a folding axis, a first stretching direction, and a second stretching direction according to an embodiment of the present disclosure.

Referring to FIG. 3, a second acute angle β is formed between the vertical line F' of the folding axis and the first stretching direction, and a third acute angle γ is formed between the vertical line F' of the folding axis and the second stretching direction, when the tensile strength along the first stretching direction of the linear polarization film 101 is greater than the tensile strength along the second stretching direction of the phase delay film 102, β>γ; when the tensile strength along the first stretching direction of the linear polarization film 101 is smaller than the tensile strength along the second stretching direction of the phase delay film 102, β<γ. It can be understood that, when the film is folded along the folding axis, a direction of the bending stress on the film is perpendicular to the folding axis, and when the folding axis is perpendicular to the stretching direction of the film, the direction of the bending stress is parallel to the stretching direction of the film, and the film has a greater tensile strength along the stretching direction. If the folding axis is not perpendicular to the stretching direction of the film, the closer the vertical line F' of the folding axis to the stretching direction of the stretched film, the greater a component of the bending stress on the stretched film along the stretching direction, so that the fracture strength of the stretched film along the folding axis is better. By comparing the tensile strength of the linear polarization film 101 along the first stretching direction with the tensile strength of the phase delay film 102 along the second stretching direction, the vertical line of the folding axis is determined to be closer to one stretching direction along which the tensile strength is smaller. Thus, the fracture strength and the anti-bending performance of the two stretched films can be balanced, to guarantee the bending stability of the anti-reflection film.

Figure 4:
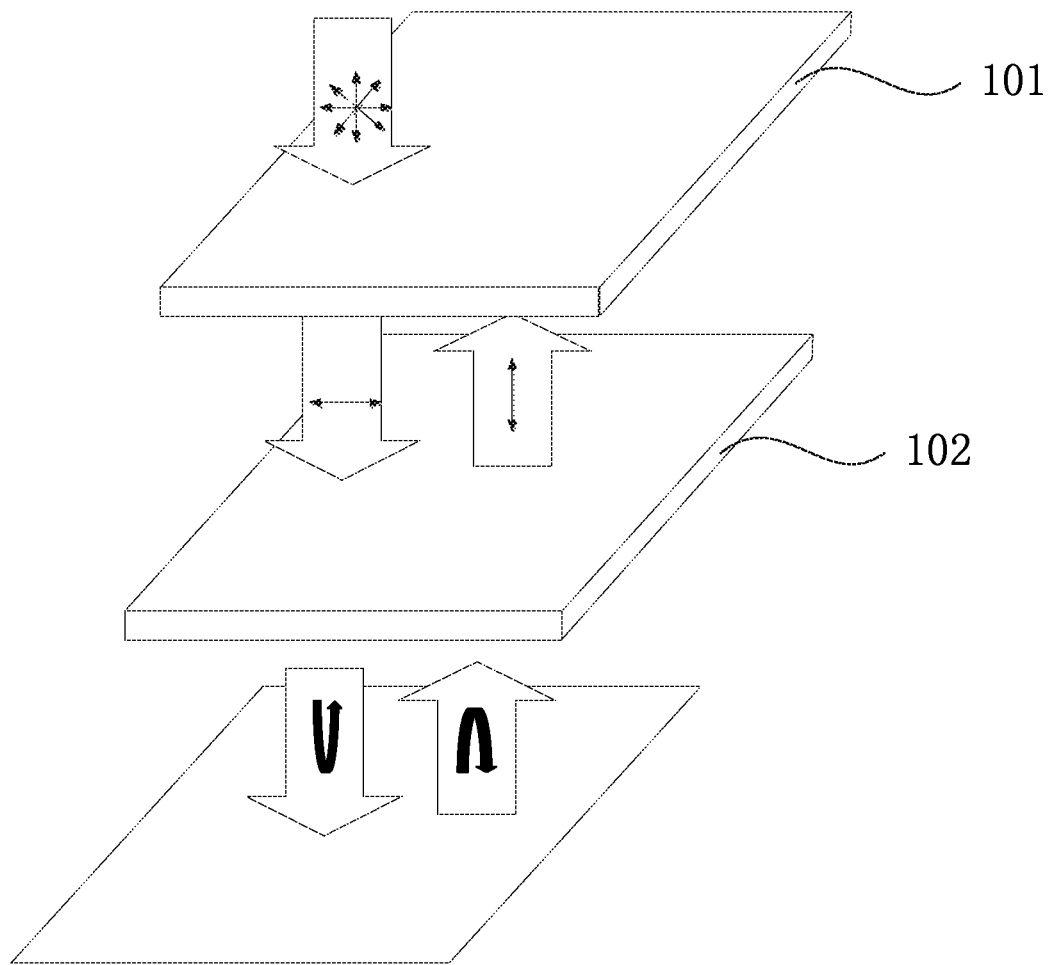
FIG. 4 illustrates an anti-reflection principle of the anti-reflection film according to an embodiment of the present disclosure.

Optionally, the phase delay film can be a quarter-wave plate. A reflection principle of the anti-reflection film provided by the embodiments of the present disclosure is shown in FIG. 4. Ambient light forms a linear polarized light by passing through the linear polarization film 101, a polarization direction of the linear polarized light is perpendicular to the absorption axis of the linear polarization film, that is, the polarization direction of the linear polarized light is perpendicular to the first stretching direction of the linear polarization film; secondly, the linear polarized light passes through the quarter-wave plate, thereby forming a phase delay of 90°, so that the linear polarized light is changed to be circular polarized light or elliptical polarized light. At this time, the circular polarized light or the elliptical polarized light has a certain rotation direction, such as right-handed rotation. Thirdly, the circular polarized light is reflected when passing through the reflection film layer, and the rotation direction is changed, the circular polarized light in a right-handed rotation becomes a circular polarized light in a left-handed rotation. Finally, the circular polarized light in a left-handed rotation becomes a linear polarized light by passing through the quarter-wave plate, at this time, compared with the incident polarized light, a polarization direction of an output polarized light has changed for 90°, the polarization direction of the output polarized light is parallel to the absorption axis of the linear polarization film, and the output polarized light is completely absorbed without emitting out. Thus, a reflection purpose is achieved.

In the anti-reflection film provided by the embodiments of the present disclosure, the acute angle between the first stretching direction and the second stretching direction can be 45°. According to the principle described as above, the optical axis of the quarter-wave plate is parallel to the second stretching direction. At this time, the acute angle between the first stretching direction and the second stretching direction is 45°, that is, the angle between the absorption axis of the linear polarization film and the optical axis of the quarter-wave plate is 45°, the linear polarized light is changed to be a circular polarized light after passing through the quarter-wave plate, and the anti-reflection film has a better anti-reflection effect.

Figure 5:
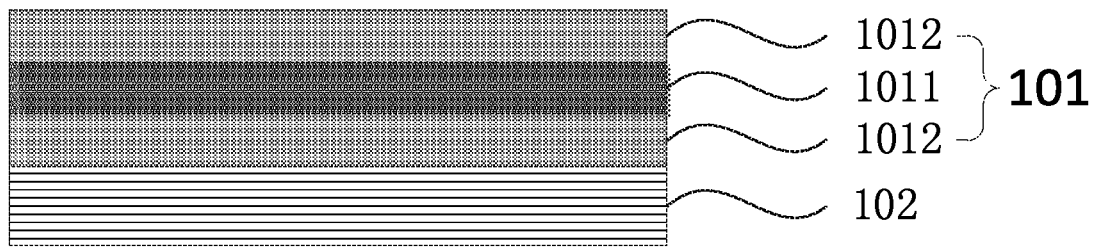
FIG. 5 illustrates a schematic view of another anti-reflection film according to an embodiment of the present disclosure.

In the embodiments of the present disclosure, in addition to the PVA film, the polarization film can further include a triacetate fiber film. Because of its hydrophilicity, in a muggy environment, the PVA film is deformed easily, and shrinks, and then is slack, so that the PVA film is difficult to be used and processed independently. Generally, triacetate fiber films can be placed on opposite sides of the PVA film to protect the PVA film, since the triacetate fiber film has a high strength, a high transmittance, and a good humidity resistance. As shown in FIG. 5, which is a schematic view of anther anti-reflection film according to an embodiment of the present disclosure, the anti-reflection film includes a linear polarization film 101 and a phase delay film 102. The linear polarization film 101 includes a PVA film 1011 and two triacetate fiber films 1012, and the PVA film 1011 is placed between the two triacetate fiber films 1012. The PVA film is stretched along a first stretching direction to have a polarization property. The triacetate fiber films 1012 are used to protect the PVA film 1011. The first stretching direction of the linear polarization film 101 is the stretching direction of the PVA film.

Figure 6:
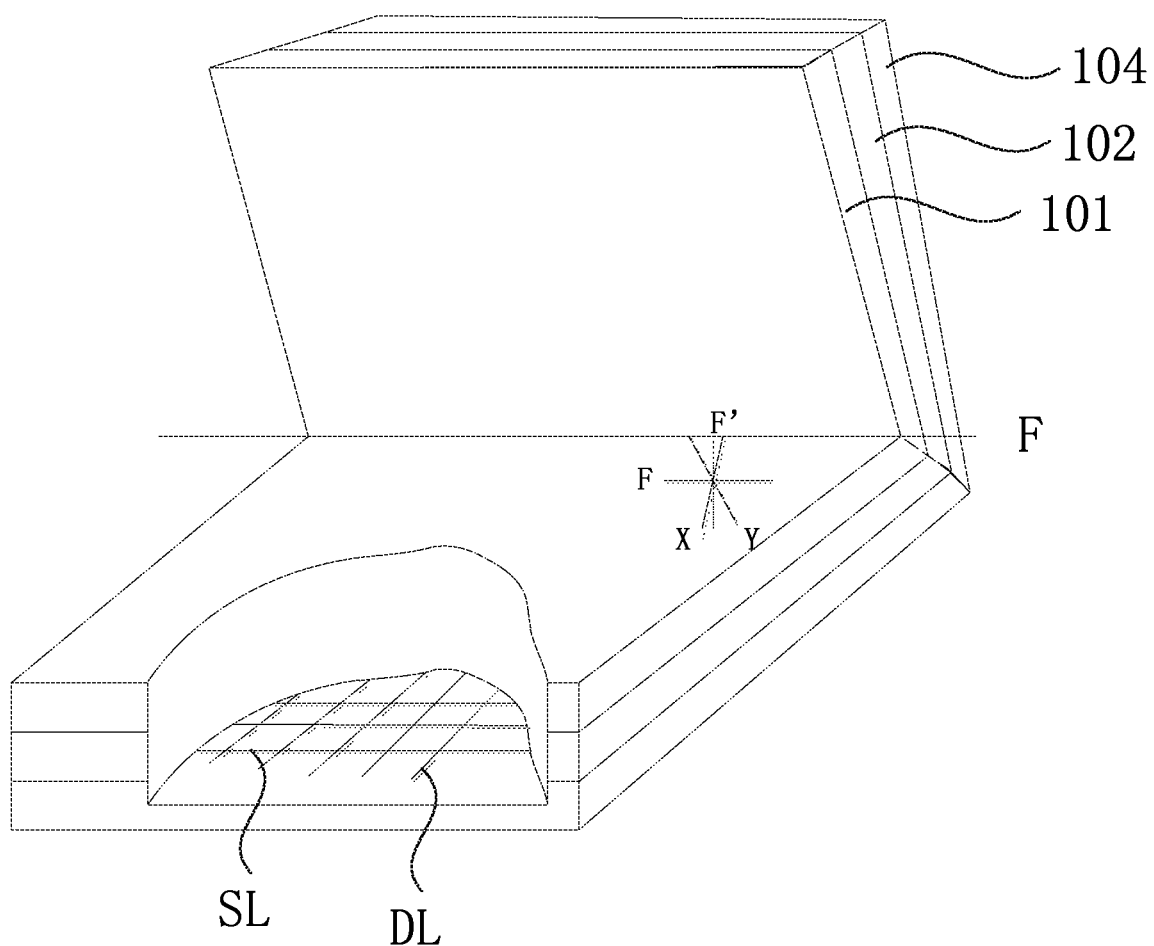
FIG. 6 illustrates a schematic view of a flexible display device according to an embodiment of the present disclosure.

Optionally, the embodiment of the present disclosure provides a flexible display device. As shown in FIG. 6, which is a schematic view of a flexible display panel provided by an embodiment of the present disclosure, the flexible display device includes a flexible display panel 104. The flexible display panel 104 is folded along a folding axis F. The anti-reflection film is adhered to a surface of the flexible display panel. The flexible display panel can be bended, folded, and rolled with respect to an axis of the folding axis. Generally, the organic light-emitting diode display panel can be used as a flexible display panel to be bended, folded, and rolled. The organic light-emitting diode display panel is self-luminescent. The anti-reflection film is adhered to the surface of the organic light-emitting diode display panel, which has a good anti-reflection effect for an ambient light to the interior of the display panel. The phase delay film is placed between the linear polarization film and the flexible display panel. The anti-reflection film is placed on a display surface of the flexible display device. Thus, before entering into the flexible display panel, the ambient light may pass through the linear polarization film of the anti-reflection film, so that the ambient light is changed to be a linear polarized light, and then the linear polarized light passes through the phase delay film.

Optionally, the flexible display panel includes a plurality of gate lines SL and a plurality of data lines DL. The gate lines SL and the data lines DL intersect to define a plurality of pixel areas. A light-emitting unit for emitting light and a thin film transistor for controlling the light-emitting unit are placed in each pixel area. One end of the gate line is electrically connected with the gate electrode of the thin film transistor, and the other end of the gate line is connected with the gate controller, for controlling on and off of the thin film transistor. One end of the data line is electrically connected with a source electrode or a drain electrode of the thin film transistor, and the other end of the data line is connected to an integrated chip, for providing signals to the light-emitting unit. Generally, the flexible display device can be folded along an extending direction of the gate line, that is to say, the folding axis of the flexible display panel is parallel to the extending direction of the gate line. At this time, a first acute angle α is formed between a first stretching direction X of the linear polarization film 101 and a second stretching direction Y of the phase delay film, and a vertical line F' of the folding axis is located in the first acute angle α. Thus, the anti-reflection film of the flexible display panel has good anti-bending performance and good fracture resistance. The flexible display device provided by the embodiments of the present disclosure can be cellphone, desktop computer, laptop computer, tablet computer, digital photo frame, and so on.

What is claimed is:
1. An anti-reflection film, comprising:
a linear polarization film stretched in a first stretching direction; and
a phase delay film stretched in a second stretching direction;
wherein when a light beam passes through the linear polarization film, the light beam is converted into a linear polarized light, and when the light beam passes through the phase delay film, the phase delay film changes a phase of the light beam, wherein a first acute angle α is formed between the first stretching direction and the second stretching direction, and wherein the anti-reflection film has a folding axis, and a vertical line of the folding axis is located within the first acute angle α in a plane of the anti-reflection film.

2. The anti-reflection film according to claim 1, wherein a second acute angle β is formed between the first stretching direction and the vertical line of the folding axis, and a third acute angle γ is formed between the second stretching direction and the vertical line of the folding axis;

when a tensile strength of the linear polarization film along the first stretching direction is greater than a tensile strength of the phase delay film along the second stretching direction, then β>γ; and when the tensile strength of the linear polarization film along the first stretching direction is smaller than the tensile strength of the phase delay film along the second stretching direction, then β<γ.

3. The anti-reflection film according to claim 2, wherein the linear polarization film comprises a polyvinyl alcohol film.

4. The anti-reflection film according to claim 3, wherein the linear polarization film further comprises two triacetate fiber films, and the polyvinyl alcohol film is placed between the two triacetate fiber films.

5. The anti-reflection film according to claim 2, wherein the phase delay film comprises at least one of cycloolefin copolymer and polycarbonate.

6. The anti-reflection film according to claim 5, wherein the phase delay film is a quarter-wave plate.

7. The anti-reflection film according to claim 6, wherein an optical axis of the quarter-wave plate is parallel to the second stretching direction.

8. The anti-reflection film according to claim 1, wherein a transmission direction of the linear polarization film is perpendicular to the first stretching direction.

9. The anti-reflection film according to claim 1, wherein the first acute angle α is 45°.

10. A flexible display device, comprising an anti-reflection film and a flexible display panel, wherein the anti-reflection film comprises:

a linear polarization film stretched in a first stretching direction; and a phase delay film stretched in a second stretching direction;

wherein when a light beam passes through the linear polarization film, the light beam is converted into a linear polarized light, and when the light beam passes through the phase delay film, the phase delay film changes a phase of the light beam, wherein a first acute angle α is formed between the first stretching direction and the second stretching direction, and wherein the anti-reflection film has a folding axis, and a vertical line of the folding axis is located within the first acute angle α in a plane of the anti-reflection film, wherein the flexible display panel is foldable along the folding axis of the anti-reflection film, and the anti-reflection film is adhered to a surface of the flexible display panel.

11. The flexible display device according to claim 10, wherein the phase delay film is placed between the linear polarization film and the flexible display device, and the anti-reflection film is placed on a display surface of the flexible display panel.

12. The flexible display device according to claim 10, wherein the flexible display panel is an organic light-emitting diode display panel.

13. The flexible display device according to claim 10, further comprising a gate line and a data line intersected with the gate line, wherein a direction of the folding axis is parallel to an extending direction of the gate line.

* * * * *